(12) United States Patent
Gandolfi et al.

(10) Patent No.: US 7,034,725 B2
(45) Date of Patent: Apr. 25, 2006

(54) METHOD FOR SELF-CALIBRATING A PHASE INTEGRATION ERROR IN A MODULATOR

(75) Inventors: Gabriele Gandolfi, Siziano (IT); Andrea Baschirotto, Tortano (IT); Vittorio Colonna, Landriano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 601 days.

(21) Appl. No.: 10/329,988

(22) Filed: Dec. 26, 2002

(65) Prior Publication Data
US 2003/0149538 A1   Aug. 7, 2003

(30) Foreign Application Priority Data
Dec. 27, 2001  (EP)  ................... 01830815
May 31, 2002  (EP)  ................... 02012046

(51) Int. Cl.
*H03M 3/00*  (2006.01)
*G06G 7/184*  (2006.01)

(52) U.S. Cl. ...................... 341/143; 327/337

(58) Field of Classification Search ................ 341/143; 327/336–345
See application file for complete search history.

(56) References Cited

U.S. PATENT DOCUMENTS 4,718,036 A * 1/1988 Halbert et al. .............. 708/823
6,172,631 B1    1/2001 Tsai et al. .................... 341/143

OTHER PUBLICATIONS

Fattaruso et al., *Self-Calibration Techniques for a Second-Order Multibit Sigma-Delta Modulator,* IEEE International Sold State Circuits Conference, IEEE Inc., New York, vol. 36, Feb. 1993, pp. 228-229, 293, XP000388087.
Ueno et al., *An Oversampled Sigma-Delta A/D Converter Using Time Division Multiplexed Integrator,* Circuits and Systems, 1990, Proceedings of the $33^{rd}$ Midwest Symposium, Calgary, Alberta, Aug. 12-14, 1990, IEEE, Aug. 12, 1990, pp. 748-751, XP01004946.

* cited by examiner

*Primary Examiner*—David Mis
(74) *Attorney, Agent, or Firm*—Lisa K. Jorgenson; Allen, Dyer, Doppelt, Milbrath & Gilchrist, P.A.

(57) ABSTRACT

A method of self-calibrating a modulator includes at least one integrator likely to incur a phase error may include reading a pulse response of the modulator, calculating a phase error parameter of the at least one integrator, and calibrating the phase error parameter. In addition, the calibration may provide a count of pulse response samples above suitable threshold values, as well as a change in the value of a capacitor associated with the integrator based upon the sample count.

30 Claims, 7 Drawing Sheets

FIG. 7

METHOD FOR SELF-CALIBRATING A PHASE INTEGRATION ERROR IN A MODULATOR

FIELD OF THE INVENTION

The present invention relates to the field of electronic circuits, and, more particularly, to a method of self-calibrating a phase integration error in a modulator, such as a modulator of the type having at least one integrator and that is likely to have a phase error.

Furthermore, the present invention relates generally to an integrator system with phase error correction which includes an integrator having an input terminal connected to an inverting output terminal through a first feedback capacitor, and a second input capacitor connected between a first input terminal of the integrator system and the input terminal of the integrator. The invention further relates generally to a modulator structure with phase error correction which includes an oscillation loop connected between an input terminal and an output terminal. The oscillation loop may include first and second (as well as other) integrators with first and second integration coefficients provided between the input terminal and the oscillation loop, and a feedback coefficient provided between the second integrator and the input terminal.

Additionally, the invention particularly relates, but not exclusively, to a high-performance band-pass modulator of the sigma-delta ($\Sigma\Delta$) type. The following description will make reference to this field of application for convenience of illustration.

BACKGROUND OF THE INVENTION

High-performance band-pass modulators of the sigma-delta ($\Sigma\Delta$) type high-performance are used in many communication systems, such as in audio signal, MPX, and medium frequency (i.e., 10.7 MHz) modulators. Some of the desired requirements of such modulators include high dynamic range, compact size, and low power dissipation.

A band-pass structure of the sigma-delta ($\Sigma\Delta$) low-order (usually second-order) multi-bit type is often used to meet such requirements. One problem with band-pass modulators of the sigma-delta type is centering the so-called noise notch (i.e., noise mid-frequency) with a given accuracy, such as within 0.2% with respect to a nominal value (e.g., 10.7 MHz). Yet, without such centering the dynamic range of the output signal from the modulator will be significantly diminished.

Figure 1:
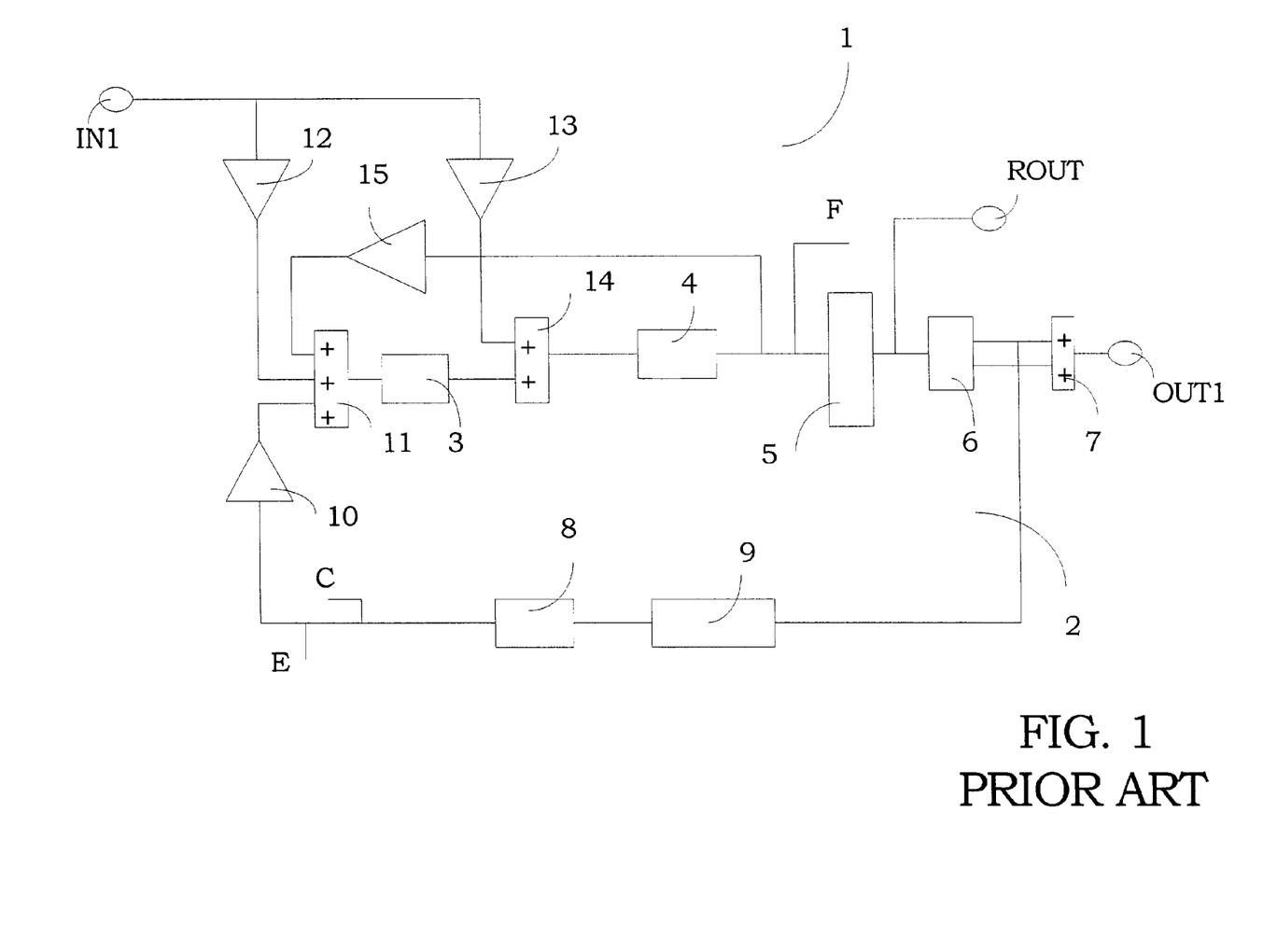
FIG. 1 is a schematic block diagram of a band-pass structure of a prior art modulator.

A prior art sigma-delta modulator structure 1 is illustratively shown in FIG. 1. The modulator 1 includes an oscillator loop 2 connected between an input terminal IN1 and an output terminal OUT1. The oscillation loop 2 includes first and second integrators 3 and 4, a quantizer 5, and stabilizer 6, all of which are connected in series together between the input terminal IN1 and the output terminal OUT1.

In particular, the stabilizer 6 has a first output terminal feedback-connected via a randomizer 8, a delay element 9, and a first integration coefficient generator 10, to a first summing element 11. The summing element 11 is connected between the input terminal IN1 and the first integrator 3. The stabilizer 6 is also connected to the output terminal OUT1 through a second summing element 7, to which a second output terminal of the stabilizer is also connected.

The modulator 1 also includes a second integration coefficient generator 12 connected between the input terminal IN1 and the first summing element 11. A third integration coefficient generator 13 is connected between the input terminal IN1 and the second integrator 4 through a third summing element 14. The modulator 1 further includes a feedback coefficient generator 15 which is connected between an output terminal of the second integrator 4 and the first summing element 11, and an output verify terminal ROUT1 at an output terminal of the quantizer 5.

In particular, the integration coefficient generators 10, 12 and 13 and the feedback coefficient 15 are provided in a relatively simple manner using appropriate capacitance ratios. It should be noted that, in a conventional modulator as shown in FIG. 1, the following are the factors primarily cause the mid-frequency to shift. First, the capacitive matching of the elements in the modulator 1 changes certain coefficients, particularly the gain g thereof.

Further, the non-ideal nature of the integrators 3 and 4, which have finite gain and band·gain product, introduce respective phase errors $b_1$, $b_2$ and gain errors $a_1$, $a_2$ in accordance with the following general relation:

$$\frac{y_n(z)}{x_n(z)} = \frac{a_n * z^{-1}}{1 - b_n * z^{-1}}. \qquad (1)$$

The drop in performance of the modulator 1 is therefore essentially tied to the base block that includes the oscillation loop 2, which, in turn, includes the two integrators 3, 4 and determines the gain coefficient g.

Figure 2:
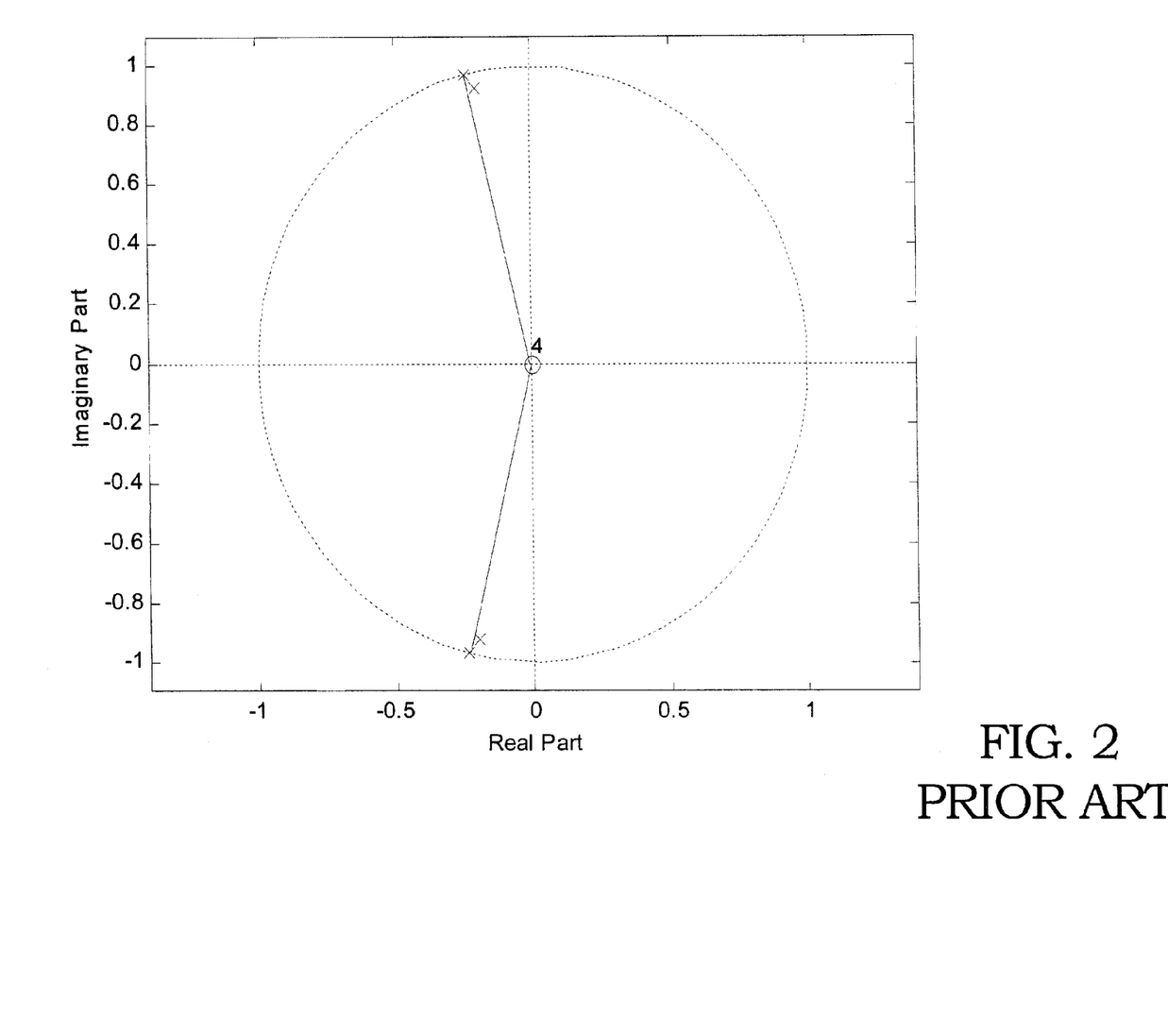
FIG. 2 is a graph illustrating the pattern of the poles of the frequency response of the modulator of FIG. 1.
Figure 3:
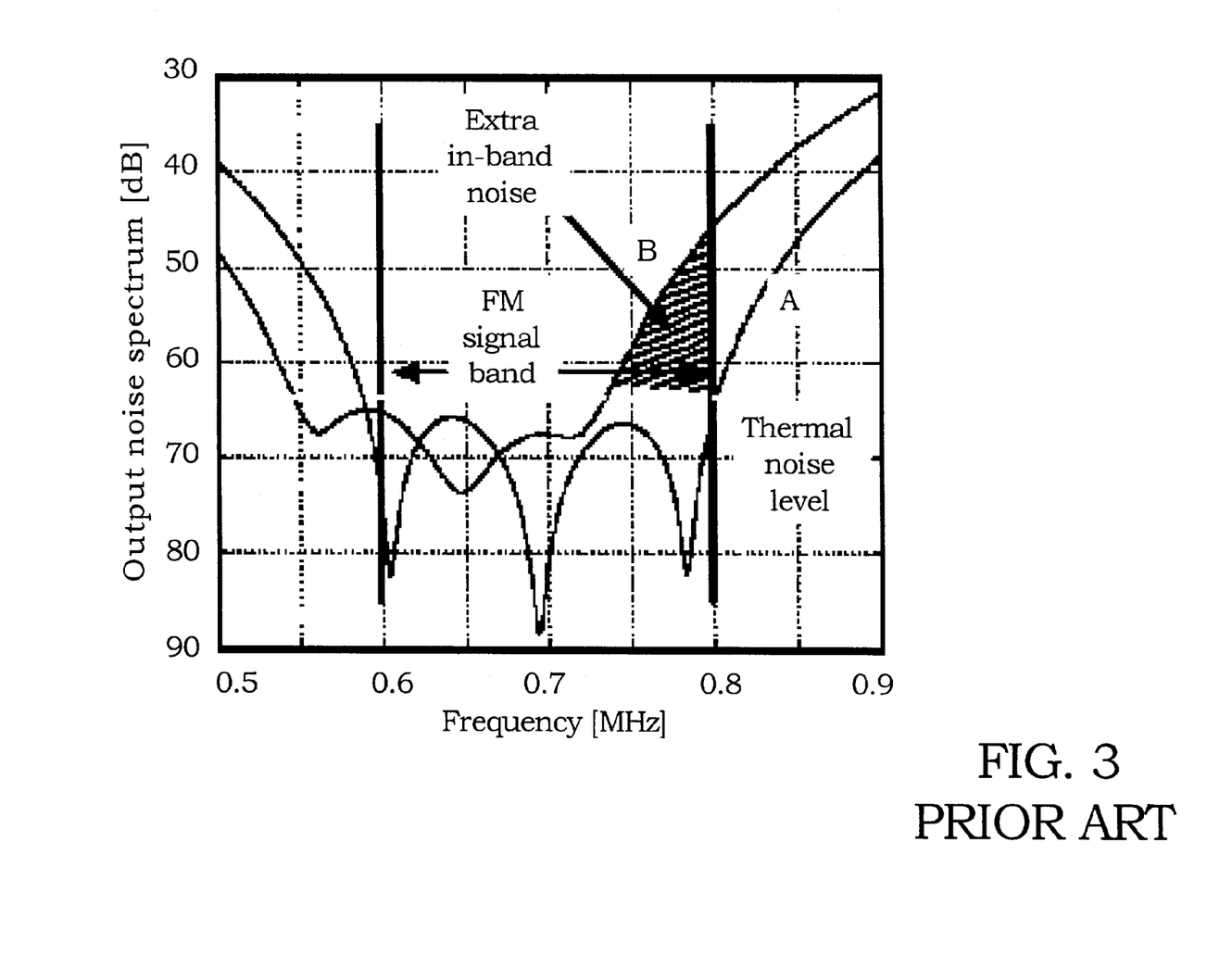
FIG. 3 is a graph of the noise spectrum of the output signal from the modulator of FIG. 1 plotted against frequency.
Figure 4:
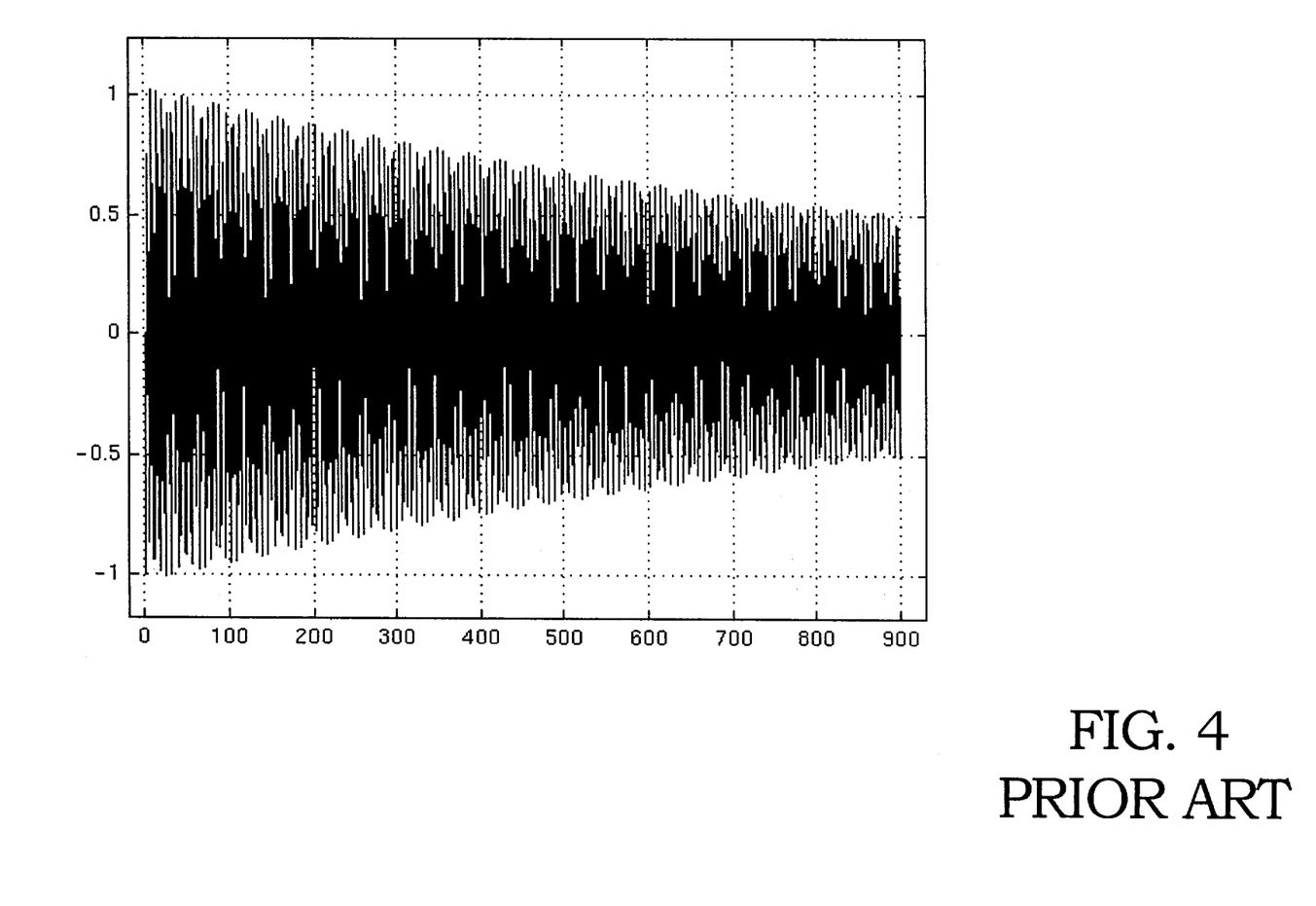
FIG. 4 is a graph illustrating the pulse response pattern of the modulator of FIG. 1.

In particular, the oscillation loop 2 generates two complex conjugate-modulo poles, which ideally are positioned 10.7 MHz from each other, as shown schematically in FIG. 2. The coefficient g and gain error $a_n$ of the integrators alter the pole angle, while the phase error $b_n$ of the integrators alters the pole modulo. Thus, the output noise spectrum from the modulator 1 is as shown schematically in FIG. 3, where the shaded area is the undesired offband noise.

Various prior art self-calibration methods are known in which the pulse response of an open-loop filter is utilized to measure the mid-frequency of the modulated signal. To have this parameter satisfactorily calibrated, however, a sequence of sample responses-to-pulse are to be monitored for an extended length of time. It therefore becomes necessary to control the phase integration error, because the pulse response tapers out in relation to this parameter.

For this purpose, such prior art typically use a master/slave system in which a master circuit is controlled to calibrate the modulator 1, with the modulator forming the slave circuit. This technique involves duplicating the modulator hardware, and is beset with problems of matching the master and slave structures. Such method may also compensate the effect of the finite gain introduced by the integrators, as well as increase the area of the capacitors inside the modulator 1 to achieve a match within less than 0.2%.

SUMMARY OF THE INVENTION

It is an object of the invention to provide a method of self-calibrating a sigma-delta ($\Sigma\Delta$) modulator which can compensate for phase error caused by the modulator.

A method in accordance with the invention may include reading the pulse response of the modulator, computing a phase error parameter, and calibrating the phase error parameter by counting sample responses which are above a suitably selected threshold.

Additionally, an integrator system is also provided in accordance with the invention in which phase error correction is provided by a variable capacitor. This eliminates certain drawbacks associated with prior art approaches such as hardware duplication, undesired leftover effects, and the need for increased capacitance.

BRIEF DESCRIPTION OF THE DRAWINGS

The features and advantages of the self-calibration method, integrator system, and the modulator structure according to the invention will be apparent from the following description of embodiments thereof, given by way of non-limiting example, with reference to the accompanying drawings, in which.

DETAILED DESCRIPTION OF THE PREFERRED EMBODIMENTS

The self-calibration method according to the invention will be described in relation to a second-order multi-bit band-pass modulator of the sigma-delta (ΣΔ) type, by way of example and not of limitation. In particular, the described method and the results obtained thereby apply equally to other types of switched integrators.

The self-calibration method of the invention advantageously allows for the analysis of the amplitude of the pulse response of the modulator to correct the phase error incurred by the integrators that is inherent in the modulator. With reference to a conventional modulator structure, such as the modulator 1 shown in FIG. 1, due to its non-ideal nature and the capacitive matching problem, the transfer functions of the first and second integrators 3 and 4 are given as:

$$\frac{y_1(z)}{x_1(z)} = \frac{a_1 * z^{-1}}{1 - b_1 * z^{-1}}, \quad (2)$$

and $$\frac{y_2(z)}{x_2(z)} = \frac{a_2 * z^{-1}}{1 - b_2 * z^{-1}}, \quad (3)$$

where $a_1$, $a_2$ are the gain error parameters, and $b_1$, $b_2$ are the phase error parameters of the integrators. It should be noted that the parameters $a_1$, $a_2$ and $b_1$, $b_2$ would equal one under ideal conditions and less than one under real conditions.

The method according to the invention advantageously includes measuring the phase error parameters ($b_1$, $b_2$) of the integrators and calibrating these parameters by the pulse response of the modulator. As will be described in detail below, the pulse response of a modulator takes the following form:

$$V_0(n*T) = K^{n*T} * \sin(n*\omega_0 *T), \quad (4)$$

where K is the so-called dumping factor and equals $b_1 * b_2$. As the parameters $b_1$ and $b_2$ approach unity, the dumping factor K also approaches unity, and the pulse response remains other than zero through several cycles. Otherwise, the response becomes zero after a few samples, and will provide no accurate analysis of the pulse response of the modulator structure.

In accordance with the invention, the self-calibration method advantageously includes measuring the phase error parameters $b_1$ and $b_2$, and performing calibration to bring these parameters as close as possible to one (the ideal value). The correct parameters $b_1$ and $b_2$ will be advantageously less than one to avoid stability problems of the modulator.

In particular, the self-calibration method according to the invention includes reading the modulator pulse response, calculating the values of the phase error parameters $b_1$ and $b_2$, and calibrating the parameters $b_1$ and $b_2$ to make them equal to target values. For simplicity, only the phase error parameter $b_1$ will be considered herein, since the same reasoning would apply to the phase error parameter $b_2$ as well.

In particular, the reading step uses the response to a pulse signal δ of the integrator having the following form:

$$y(n*T) = b_1{}^n * K * a_1. \quad (5)$$

Using the well-known mathematical tool represented by the Z-transform, it can be easily shown that the transfer function of the integrator takes the form:

$$\frac{y(z)}{x(z)} = \frac{a_1 * z^{-1}}{1 - b_1 * z^{-1}}, \quad (6)$$

Since, based on the Z-transform:

$$Z(k*\delta(n*T)) = k, \quad (7)$$

the Z-transform of the modulator output is given by:

$$y(z) = \frac{k * a_1 * z^{-1}}{1 - b_1 * z^{-1}}. \quad (8)$$

Figure 5:
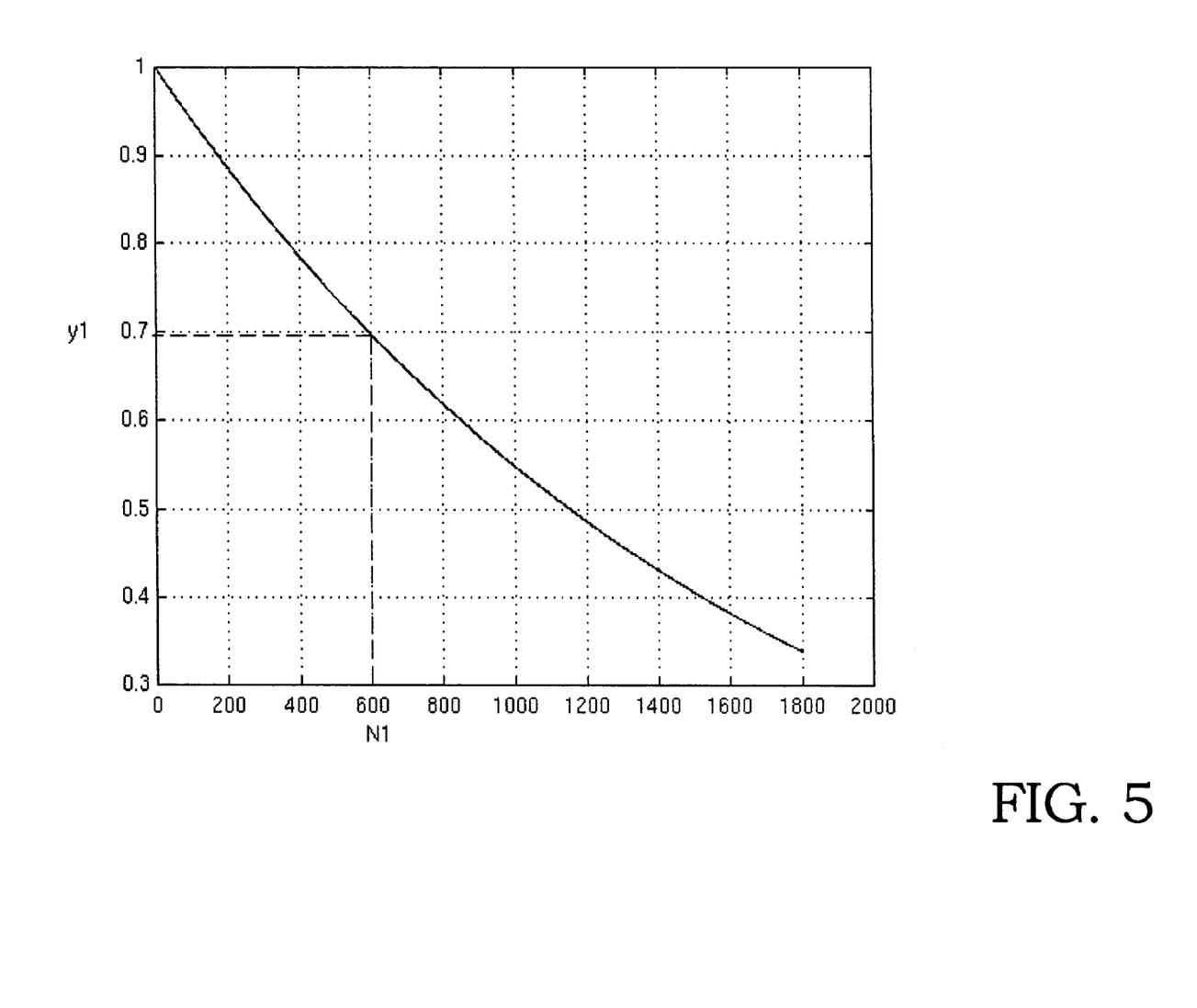
FIG. 5 is a graph illustrating the pulse response pattern of a modulator structure according to the invention.

Reverse-transforming equation (8) based on the known Z-transform table provides equation (5). The pattern of the output y(nT) when the product k·$a_1$ is one and $b_1$=0.9994 is illustratively shown in FIG. 5.

According to the invention, the phase error self-calibration method advantageously includes calculating the phase error parameter $b_1$ by measuring a number N1 of samples for which the pulse response given by equation (5) is above a threshold value y1. Thus, the phase error parameter $b_1$ of the integrator can be calculated from the following equation:

$$(b_1)^{N_1} = \frac{y_1}{k * a_1}. \quad (9)$$

That is, once the logarithmic function is applied:

$$\text{Log}_{10}(b_1) = \frac{\text{Log}_{10}\left(\frac{y1}{k*a_1}\right)}{N1}. \tag{10}$$

Equation (10) is non-linear and can be solved in a tabular fashion, i.e., within the digital domain, and allows the value of the phase error parameter $b_1$ to be calculated.

For example, when a flash type analog-to-digital converter is used, different threshold values y1 can be found for improving the read accuracy of the inventive method, such as by dividing the range of the parameter $b_1$ to be calibrated into zones, each zone having a different threshold value. In particular, as the parameter $b_1$ has far from unity values, low values of the threshold y1 should be used. While the parameter $b_1$ has near unity values, threshold values of the threshold y1 approaching one are more suitable.

Figure 6:
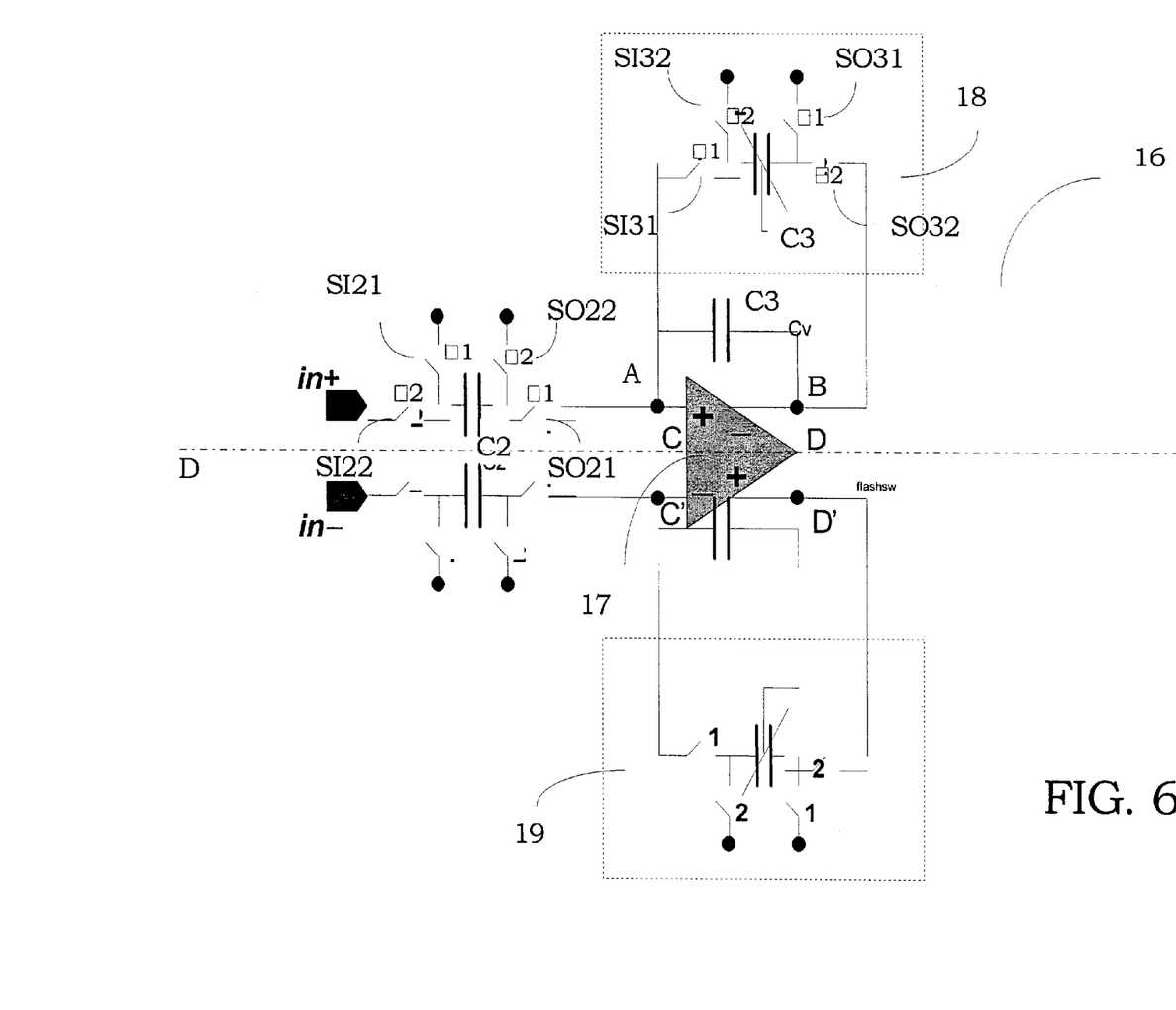
FIG. 6 is a schematic circuit diagram illustrating an integrator system with phase error correction according to the invention.

The parameter $b_1$ is corrected during calibration. An integrator system 16 with phase error correction is shown schematically in FIG. 6 is used of such calibration. In particular, the integrator system 16 includes an integrator 17 having a non-inverting input terminal A connected to an inverting output terminal B through a first feedback capacitor C1. The integrator system 16 also includes a second input capacitor C2 connected between a first input terminal IN+ and the non-inverting input terminal A of the integrator 17 through complementary pairs of switches SI21, SI22 and SO21, SO22 that are driven by first and second phase signals φ1 and φ2.

According to the invention, the integrator system 16 further includes a phase error correction portion 18 that is connected in feedback between the output terminal B and the input terminal A of the integrator 17. In particular, the correction portion 18 includes a third capacitor C3 which is connected between the output terminal B and the input terminal A of the integrator 17, again through complementary switch pairs SI31, SI32 and SO31, SO32 driven by the first and second phase signals φ1 and φ2.

In the integrator system 16, the correction portion 18 is mirrored about a line DD by another correction portion 19 into a classical full-ended configuration, for which no further description is required herein. It should be noted that, in accordance with the invention, the third capacitor C3 has variable capacitance Cv to produce a positive feedback around the integrator 17 to add an amount of charge lost to the non-ideal nature of the integrator. This increases the value of the parameter $b_1$.

In particular, the variable capacitance Cv of the third capacitor C3 places a multiplying term before the term $z^{-1}$ in the transfer function of the integrator system, thus correcting the parameter $b_1$ as per the following relation:

$$H(z) = \frac{a_1 * z^{-1}}{1 - b_1 * \left(1 + \frac{C_v}{C_2}\right) * z^{-1}}. \tag{11}$$

As the variable capacitance Cv is increased, the coefficient of $z^{-1}$ in the denominator increases to near unity value. In essence, the integrator system 16 allows the phase error of the modulator including the integrator 17 to be corrected by merely adjusting the variable capacitance value Cv.

When the above-described self-calibration method is used, the integrator system 16 is controlled by a digital algorithm providing a count of those samples whose value exceeds a suitably preset threshold value to close in upon this threshold value. In particular, the self-calibration method according to the invention includes counting the samples that are above a set of threshold values, choosing a desired value for the threshold value within the set of threshold values, solving equation (10) for obtaining the phase error parameter $b_1$ evaluation, and changing the variable capacitance value Cv according to the calculated parameter $b_1$.

The reading and calculating steps, and the step of calibrating the phase error by changing the capacitance Cv of the third capacitor C3, are advantageously repeated to bring the value of the parameter $b_1$ to within a desired range, which may be defined as follows:

$$1 - 800e^{-6} \leq b_1 \leq 1 - 400e^{-6}. \tag{12}$$

The above described self-calibration method allows most of the hardware otherwise required to be implemented in the digital domain, and the analog elements connected in the modulator structure for correction purposes may also be reduced to a minimum.

Figure 7:
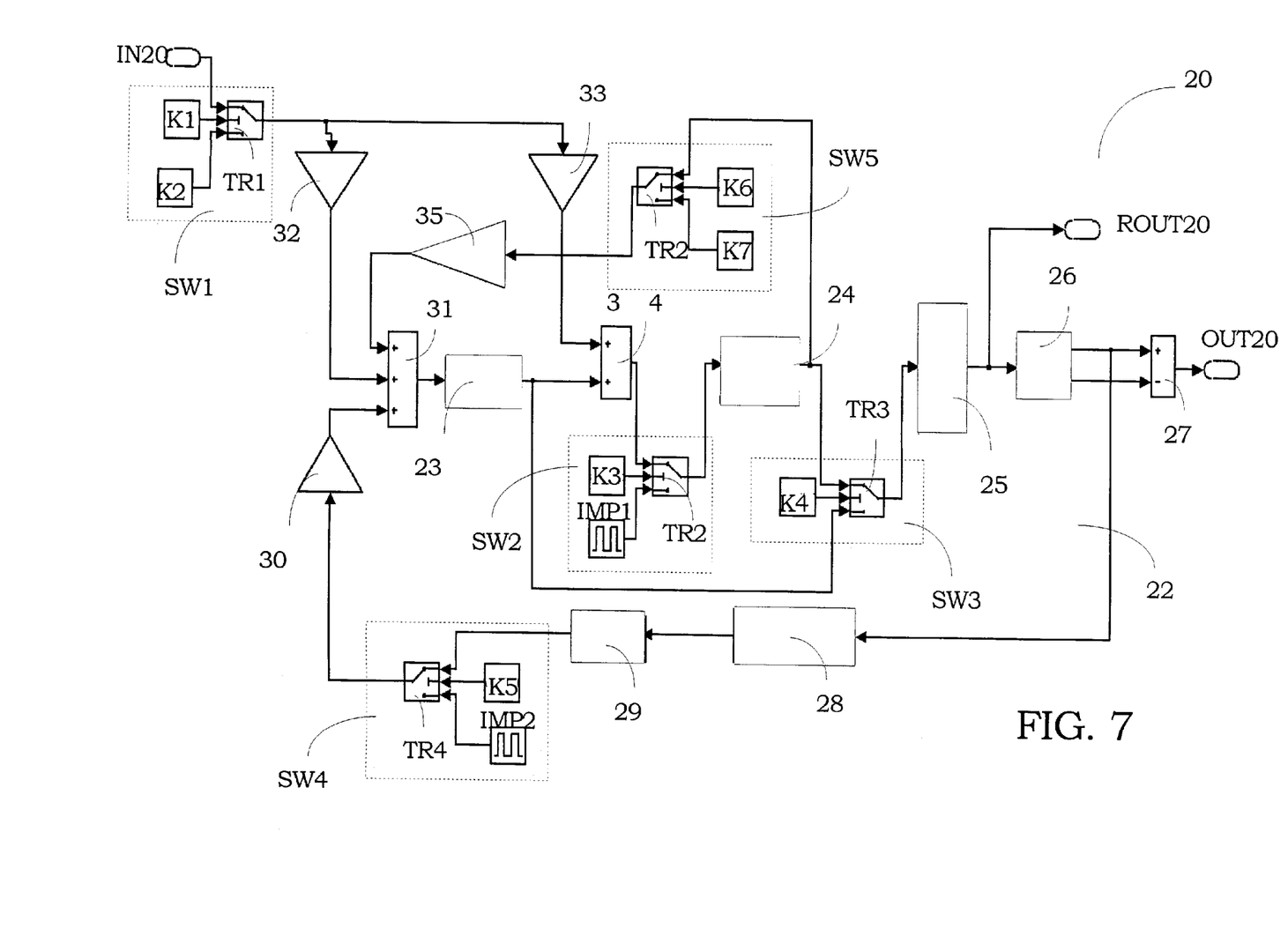
FIG. 7 is a schematic block diagram illustrating a modulator structure which implements a self-calibration method according to the invention.

A band-pass modulator structure 20 of the sigma-delta (ΣΔ) type adapted to implement a phase error correction according to the above-described self-calibration method is shown in FIG. 7. As with the prior art structure discussed above, the modulator 20 includes an oscillation loop 22 connected between an input terminal IN20 and an output terminal OUT20. The oscillation loop 22 in turn includes at least first and second integrators 23 and 24, a quantizer 25, and a stabilizer 26, all being connected in series together between the input terminal IN20 and the output terminal OUT20.

In particular, the stabilizer 26 has a first output terminal feedback connected via a randomizer 28, a delay element 29, and a first integration coefficient generator 30, to a first summing element 31. The first summing element 31 is connected between the input terminal IN20 and the first integrator 23, and is also connected to the output terminal OUT20 through a second summing element 27 having a second output terminal of the stabilizer 26 connected thereto.

The modulator 20 also includes a second integration coefficient generator 32 connected between the input terminal IN20 and the first summing element 31. A third integration coefficient generator 33 is connected between the input terminal IN20 and the second integrator 24 through a third summing element 34. The modulator 20 further includes a feedback coefficient generator 35 between an output terminal of the second integrator 24 and the first summing element 31, as well as an output verify terminal ROUT20 at the output terminal of the quantizer 25. The integration coefficient generators 30, 32 and 33, and the feedback coefficient generator 35 are in the form of appropriate capacitive ratios.

To implement the self-calibration method according to the invention, a first switch block SW1 is connected between the input terminal IN20 and the second and third integration coefficients 32 and 33. Further, a second switch block SW2 is connected between the third summing element 34 and the second integrator 24. Also, a third switch block SW3 is connected between the second integrator 24 and the quantizer 25, and a fourth switch block SW4 is connected between the delay element 29 and the first integration coefficient 30. Moreover, a fifth switch block SW5 is connected between the output of the second integrator 24 and the feedback coefficient 35.

More particularly, the first switch block SW1 includes a three-way switch TR1 which receives the signal at the input terminal IN20 and first and second constant signals K1 and K2. An output of the switch TR1 is connected to the second and third integration coefficients 32 and 33. The second switch block SW2 similarly includes a three-way switch TR2 which receives a third constant signal K3, a first pulse signal IMP1, and the output signal from the third summing element 34, and its output is connected to the second integrator 24.

Also, the third switch block SW3 includes a three-way switch TR3 which receives a fourth constant signal K4 and the output signals from the first and second integrators 23 and 24, and its output is connected to the quantizer 25. Furthermore, the fourth switch block SW4 includes a three-way switch TR4 which receives a fifth constant signal K5, a second pulse signal IMP2, and the output signal from the delay element 29, and its output is connected to the first integration coefficient 30.

Furthermore, the fifth switch block SW5 includes a three-way switch TR5 which receives sixth and seventh constant signals K6 and K7 and the output signal from the second integrator 24. Its output is connected to the feedback coefficient 35.

The modulator 20 is adapted to implement the self-calibration method according to the invention. In particular, the fourth switch block SW4 breaks the oscillation loop 22 after the delay element 29 and allows the notch frequency of the modulator noise to be measured. In this way, the noise contribution from the input terminal IN20 is suppressed, and a pulse signal IMP2 can be input to the first integration coefficient 30. The pulse response of the modulator 20 is then measured at the input of the quantizer 25 using the third switch block SW3.

To summarize, the self-calibration method according to the invention, as implemented by the modulator 20 of FIG. 7, includes the following steps. First, the value of the parameter $b_1$ of the first integrator 23 is read by resetting the switch blocks SW1, SW4, SW5 and SW3 in this order. This suppresses the contribution from the input terminal IN20, applies a pulse signal IMP1 to the first integrator 23 and opens the circuit of the modulator 20, breaks the oscillation loop 22, and connects the output of the first integrator 23 to a flash analog-to-digital converter.

Furthermore, the difference of the read value of the actual parameter $b_1$ from its target value is computed, and the value of parameter $b_1$ is corrected by programming the variable capacitor Cv of an integrator system 16 with phase error correction, as shown in FIG. 6, which includes the first integrator 23, using the results obtained above. The above steps are then repeated until the measured value of parameter $b_1$ equals the target value plus or minus a preset allowed error.

It should be noted that, in accordance with the invention, the value of parameter $b_1$ is advantageously measured by counting the samples of the modulator pulse response which are above appropriate threshold values. Further, the value Cv of the capacitor associated with the integrators keeps changing until the phase error parameter $b_1$ satisfies equation (12) above. The sequence of steps listed above is then applied to the second integrator 24, starting with the switch block SW2 being reset instead of switch block SW1. Although the ideal values of the phase error parameters $b_1$ and $b_2$ are one, to achieve the target performance and a stable system any parameters that satisfy equation (12) above may be used.

What is claimed is:

1. A method of calibrating a modulator including at least one integrator having a phase error and a variable capacitor associated with the at least one integrator, the method comprising:
    sampling a pulse response of the modulator;
    calculating a phase error parameter of the at least one integrator; and
    calibrating the phase error parameter by providing a count of the pulse response samples above a threshold value and changing a capacitance of the variable capacitor based upon the count.

2. The method according to claim 1 further comprising repeating the calculation and calibration until the value of the phase error parameter is within a predetermined range.

3. The method according to claim 2 wherein the predetermined range is about $1-800e^{-6} \leq b_1 \leq 1-400e^{-6}$, where $b_1$ is the phase error parameter.

4. The method according to claim 1 wherein calibrating comprises changing the capacitance of the variable capacitor based upon the count so that the phase error parameter approaches a value of one.

5. The method according to claim 1 wherein calculating comprises calculating the phase error parameter based upon the following equation:

$$(b_1)^{N1} = \frac{y1}{k * a_1},$$

by applying the logarithmic equation $$\mathrm{Log}_{10}(b_1) = \frac{\mathrm{Log}_{10}\left(\frac{y1}{k * a_1}\right)}{N1},$$

where $b_1$ is the phase error parameter, $a_1$ is a gain error parameter of the at least one integrator, y1 is the threshold value, N1 is the count of the pulse response samples above the threshold value, and k is a dumping factor.

6. The method according to claim 5 wherein calculating further comprises solving the logarithmic equation in tabular form in the digital domain.

7. The method according to claim 5 wherein calculating further comprises solving the logarithmic equation using a FLASH analog-to-digital (A/D) converter with different threshold values.

8. The method according to claim 1 wherein the modulator further comprises a feedback capacitor connected to the at least one integrator; and wherein the variable capacitor produces a positive feedback for the at least one integrator and causes the phase error parameter to change according to the relation:

$$H(z) = \frac{a_1 * z^{-1}}{1 - b_1 * \left(1 + \frac{C_v}{C_n}\right) * z^{-1}},$$

where H(z) is the transfer function of the at least one integrator, $a_1$ is a gain error parameter of the at least one integrator, and Cn is the capacitance of the feedback capacitor.

9. The method according to claim 1 wherein calculating and calibrating further comprise:
selecting a threshold value and solving the equation $$Log_{10}(b_1) = \frac{Log_{10}\left(\frac{y1}{k*a_1}\right)}{N1}$$

for the phase error parameter, where $b_1$ is the phase error parameter, $a_1$ is a gain error parameter of the at least one integrator, y1 is the threshold value, N1 is the count of the pulse response samples above the threshold value, and k is a dumping factor; and
changing the variable capacitance based upon the resulting value of $b_1$.

10. A method of calibrating a modulator including at least one integrator having a phase error and a variable capacitor associated with the at least one integrator, the method comprising:
sampling a pulse response of the modulator;
calculating a phase error parameter of the at least one integrator;
calibrating the phase error parameter so that the phase error parameter approaches a predetermined range corresponding to a value of one by providing a count of the pulse response samples above a threshold value and changing a capacitance of the variable capacitor based upon the count; and
repeating the calculation and calibration until the value of the phase error parameter is within the predetermined range.

11. The method according to claim 10 wherein the predetermined range is about $1-800e^{-6} \leq b_1 \leq 1-400e^{-6}$, where $b_1$ where $b_1$ is the phase error parameter.

12. The method according to claim 10 wherein calculating comprises calculating the phase error parameter based upon the following equation:

$$(b_1)^{N1} = \frac{y1}{k*a_1},$$

by applying the logarithmic equation $$Log_{10}(b_1) = \frac{Log_{10}\left(\frac{y1}{k*a_1}\right)}{N1},$$

where $b_1$ is the phase error parameter, $a_1$ is a gain error parameter of the at least one integrator, y1 is the threshold value, N1 is the count of the pulse response samples above the threshold value, and k is a dumping factor.

13. The method according to claim 12 wherein calculating further comprises solving the logarithmic equation in tabular form in the digital domain.

14. The method according to claim 12 wherein calculating further comprises solving the logarithmic equation using a FLASH analog-to-digital (A/D) converter with different threshold values.

15. The method according to claim 10 wherein the modulator further comprises a feedback capacitor connected to the at least one integrator; and wherein the variable capacitor produces a positive feedback for the at least one integrator and causes the phase error parameter to change according to the relation:

$$H(z) = \frac{a_1 * z^{-1}}{1 - b_1 * \left(1 + \frac{C_v}{Cn}\right) * z^{-1}},$$

where H(z) is the transfer function of the at least one integrator, $a_1$ is a gain error parameter of the at least one integrator, and Cn is the capacitance of the feedback capacitor.

16. The method according to claim 10 wherein calculating and calibrating further comprise:
selecting a threshold value and solving the equation $$Log_{10}(b_1) = \frac{Log_{10}\left(\frac{y1}{k*a_1}\right)}{N1}$$

for the phase error parameter, where $b_1$ is the phase error parameter, $a_1$ is a gain error parameter of the at least one integrator, y1 is the threshold value, N1 is the count of the pulse response samples above the threshold value, and k is a dumping factor; and
changing the variable capacitance based upon the resulting value of $b_1$.

17. An integrator system with phase error correction comprising:
an integrator having an input terminal and an output terminal and comprising a first feedback capacitor connecting the input terminal and the output terminal and a second input capacitor connected between an input terminal of the integrator system and the input terminal of said integrator; and
a phase error correction circuit connected between the input and output terminals of said integrator and comprising a variable capacitor.

18. The integrator system according to claim 17 wherein a capacitance of said variable capacitor is selected to provide positive feedback for said integrator.

19. The integrator system according to claim 17 wherein said phase error correction circuit further comprises at least one complementary switch pair driven by first and second phase signals for selectively connecting said variable capacitor between the input and output terminals of said integrator.

20. The integrator system according to claim 17 wherein the input of the integrator comprises a non-inverting input, and the output of the integrator comprises an inverting output; wherein said integrator further has an inverting input and a non-inverting output; wherein said phase error correction circuit comprises a first phase error correction circuit; and further comprising a second phase error correction circuit identical to the first phase error correction circuit and connected between the non-inverting output and the inverting input of said integrator.

21. An integrator system with phase error correction comprising:
an integrator having an inverting input, a non-inverting input, an inverting output, and a non-inverting output, said integrator comprising first feedback capacitor connecting the non-inverting input terminal and the inverting output terminal, a second feedback capacitor connecting the inverting input terminal and the non-inverting output terminal, and first and second input capacitors connected between positive and negative input terminals of the integrator system and the non-inverting and inverting input terminals of said integrator, respectively;

a first phase error correction circuit connected between the inverting output terminal and the non-inverting input terminal of said integrator, said first phase error correction circuit comprising a first variable capacitor having a capacitance selected to provide positive feedback for said integrator; and a second phase error correction circuit connected between the non-inverting output terminal and the inverting input terminal of said integrator, said second phase error correction circuit comprising a second variable capacitor having a capacitance selected to provide negative feedback for said integrator.

22. The integrator system according to claim 21 wherein said first and second phase error correction circuits each comprise at least one complementary switch pair driven by first and second phase signals for selectively connecting said variable capacitors between respective input and output terminals of said integrator.

23. A modulator with phase error correction comprising:
input and output terminals;
an oscillation loop connected between said input and output terminals and comprising
first and second integrators and first and second integration coefficient generators connected to said input terminal, and
a feedback coefficient generator connected between said second integrator and said input terminal;
a first switching circuit connected between said input terminal and said first and second integration coefficient generators;

a second switching circuit connected between said first and second integrators;

a third switching circuit connected between said second integrator and said output terminal;

a fourth switching circuit connected in said feedback loop; and a fifth switching circuit connected between said second integrator and said feedback coefficient generator.

24. The modulator according to claims 23 wherein said fourth switching circuit allows said oscillation loop to be broken to apply a pulse signal, and said third switching circuit allows a pulse response of the modulator structure to be measured.

25. The modulator according to claim 23 wherein said first, fourth, fifth and third switching circuits are reset sequentially.

26. The modulator according to claim 25 wherein said second switching circuit is reset prior to sequentially resetting said first, fourth, fifth and third switching circuits.

27. The modulator according to claim 23 wherein said second switching circuit comprises at least one switch receiving at least one pulse signal.

28. The modulator according to claim 23 wherein said third switching circuit comprises at least one switch receiving signals from said first and second integrators.

29. The modulator according to claim 23 wherein said fourth switching circuit comprises at least one switch receiving at least one pulse signal.

30. The modulator according to claim 23 wherein said fifth switching circuit comprises at least one switch receiving an output signal from said second integrator.

* * * * *